(12) United States Patent
Farino

(10) Patent No.: US 6,682,607 B1
(45) Date of Patent: Jan. 27, 2004

(54) RECONDITIONING OF SEMICONDUCTOR SUBSTRATES TO REMOVE PHOTORESIST DURING SEMICONDUCTOR DEVICE FABRICATION

(75) Inventor: Anthony J. Farino, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 88 days.

(21) Appl. No.: 10/092,215

(22) Filed: Mar. 5, 2002

(51) Int. Cl.$^7$ ................................................. B08B 3/04
(52) U.S. Cl. ........................ 134/26; 134/2; 134/32; 134/33; 134/34; 134/36; 134/42; 134/902; 510/176
(58) Field of Search ....................... 134/2, 26, 32, 134/33, 34, 36, 42, 902; 510/176

(56) References Cited

U.S. PATENT DOCUMENTS

| | | | |
|---|---|---|---|
| 4,078,102 A | | 3/1978 | Bendz et al. ............... 427/341 |
| 5,824,604 A | | 10/1998 | Bar-Gadda ................. 438/725 |
| 5,858,106 A | * | 1/1999 | Ohmi et al. .................... 134/1 |
| 6,105,588 A | | 8/2000 | Li et al. ....................... 134/1.1 |
| 6,130,169 A | | 10/2000 | Shields et al. .............. 438/725 |
| 6,159,827 A | * | 12/2000 | Kataoka et al. ............. 438/464 |
| 6,432,622 B1 | * | 8/2002 | Moon et al. ................ 430/331 |
| 6,458,518 B1 | * | 10/2002 | Moon et al. ................ 430/329 |
| 2001/0038976 A1 | * | 11/2001 | Tanabe et al. .............. 430/325 |

OTHER PUBLICATIONS

Peter Van Zant, *Microchip Fabrication*, 4th Ed., (McGraw–Hill, New York, 2000) pp. 193–280.

* cited by examiner

*Primary Examiner*—Sharidan Carrillo
(74) *Attorney, Agent, or Firm*—John P. Hohimer

(57) ABSTRACT

A method for reconditioning the surface of a semiconductor substrate to remove an unwanted (i.e. defective) layer of photoresist is disclosed. The method adapts a conventional automated spinner which is used to rotate the substrate at high speed while a stream of a first solvent (e.g. acetone) is used to dissolve the photoresist. A stream of a second solvent (e.g. methanol) is then used to clean the substrate at a lower speed, with the substrate being allowed to dry with continued rotation. The method of the present invention can be used within a photolithography track so that the substrates need never leave the track for reconditioning.

19 Claims, 1 Drawing Sheet

Section 1 - 1

Section 1 - 1

RECONDITIONING OF SEMICONDUCTOR SUBSTRATES TO REMOVE PHOTORESIST DURING SEMICONDUCTOR DEVICE FABRICATION

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates in general to semiconductor device manufacturing, and in particular to a method for removing photoresist from a substrate (also termed a wafer) during the fabrication of semiconductor devices.

BACKGROUND OF THE INVENTION

During semiconductor device manufacturing, photoresist is uniformly coated over a semiconductor substrate and then photolithographically exposed and developed to form a mask which can be used to define features of selected elements of semiconductor devices being formed on or within the substrate. In some instances, the photoresist after inspection is found to be substandard. To salvage the semiconductor substrate for reuse, the substandard photoresist must be removed (i.e. stripped) and the substrate restored to its former condition prior to coating with the photoresist.

Photoresist stripping is generally performed using a plasma. However, plasma stripping is a lengthy process which is generally performed in a different processing bay devoted to plasma etching. As a result, the substrate must be removed from a batch of substrates being processed so that the photoresist can be plasma stripped. Further processing of the batch of substrates must be delayed pending stripping of this substrate, or alternately the stripped substrate must be inserted into another batch of substrates further behind the original batch in the semiconductor process line. Plasma stripping of photoresist is also a relatively dirty process, requiring further cleaning of the substrate with an acid or solvent. Finally, the use of energetic particles in the plasma to remove the photoresist can also be damaging to the substrate and to other layers formed on the substrate (e.g. a thin oxide layer for forming the gates of transistors).

What is needed is a process for simply, quickly and effectively removing a substandard layer of photoresist from a semiconductor substrate so that the substrate can be reworked and reunited with the remaining substrates in the batch prior to further processing of the batch. The present invention provides just such a method.

An advantage of the present invention is that a substandard layer of photoresist can be completely and cleanly removed from a semiconductor substrate in a matter of a few minutes, without the substrate ever leaving a photolithographic track used for coating, exposing, developing and inspecting substrates.

A further advantage is that the method of the present invention can be incorporated into photolithography (also termed microlithography) equipment used to coat, expose, develop and inspect a photoresist layer formed on one or more semiconductor substrates so that chemical stripping of an unwanted layer of the photoresist can be performed seamlessly and automatically.

Yet another advantage of the present invention is that one or more substrates having a substandard layer of photoresist thereon can be processed to chemically strip the unwanted photoresist at the same time that other substrates within the same batch of substrates are being coated, exposed, developed, baked or inspected, thereby minimizing any delay in processing the batch to rework the photoresist layer on one or more substrates therein.

These and other advantages of the present invention will become evident to hose skilled in the art.

SUMMARY OF THE INVENTION

The present invention relates to a method for reconditioning a surface of a semiconductor substrate (e.g. comprising silicon) to remove an unwanted layer of photoresist therefrom during semiconductor device fabrication. The method comprises dissolving the layer of photoresist by rotating the substrate and contacting the layer of photoresist on the surface of the rotating substrate with a stream of a first solvent (e.g. acetone), with the first solvent and the dissolved photoresist further being urged off the surface of the substrate by the rotation thereof; cleaning the surface of the substrate and removing any of the remaining first solvent or dissolved photoresist from the surface of the substrate by contacting the surface of the substrate with a stream of a second solvent (e.g. methanol) while the substrate is being rotated; and drying the substrate and removing any of the remaining second solvent from the surface of the substrate by rotating the substrate for a time after the streams of the first and second solvents have been shut off.

The rotation speed of the substrate can be reduced during cleaning the surface of the substrate as compared to the rotation speed used during the step for dissolving the layer of photoresist. The rotation speed can then be optionally increased to aid in during drying the substrate. The exact rotation speeds for the various process steps can be selected depending upon a particular size semiconductor substrate. As an example, a rotation speed of 3000 revolutions per minute (rpm) or higher can be used during the step for dissolving the layer of photoresist; and the rotation speed can be reduced to between 2000 and 3000 rpm during cleaning the surface of the substrate.

The stream of the first solvent contacts the photoresist for sufficient time to dissolve substantially all the photoresist for removal thereof by centrifugal force provided by the rotating substrate, with the stream of the first solvent preferably being directed proximate to the center of the surface of the substrate during the step for dissolving the photoresist. The stream of the second solvent is also initially directed proximate to the center of the surface of the substrate, and can then be moved toward the edge of the substrate during the step for cleaning the surface of the substrate. This helps to ensure that the first and second solvents and the dissolved photoresist are all swept off the surface of the substrate by the centrifugal force produced by the rotating substrate. The stream of the first solvent (e.g. acetone) is generally shut off within a few seconds after the stream of the second solvent (e.g. methanol) contacts the surface of the substrate; and drying of the substrate by evaporation of any remaining solvent occurs within 30–60 seconds after both the streams of the first and second solvents have been shut off.

The present invention further relates to a method for removing photoresist from a semiconductor substrate during semiconductor device fabrication, comprising the following steps in order: contacting a surface of the substrate containing the photoresist to be removed with a stream of acetone while the substrate is being rotated, with the stream of acetone being initially directed proximate to the center of the surface of the substrate and thereby dissolving and removing at least a portion of the photoresist; contacting the surface of the substrate with a stream of methanol while the substrate is being rotated for removing any remaining dissolved photoresist from the surface of the substrate, with the stream of methanol being initially directed proximate to the center of the surface of the substrate, and overlapping in time with the stream of acetone, and with the stream of methanol continuing to be present for a period of time after the stream of acetone is shut off; moving the stream of methanol away from the center of the surface of the substrate toward an outer edge thereof during the period of time after the stream of acetone has been shut off, and simultaneously reducing the rotation speed of the substrate; shutting off the stream of methanol proximate to the outer edge of the substrate; and drying the substrate by continuing to rotate the substrate for a time after the stream of methanol has been shut off.

The rotation speed of the substrate during the step for contacting the surface of the substrate with the stream of acetone is preferably higher than the rotation speed during the step for moving the stream of methanol away from the center of the surface of the substrate toward the outer edge thereof; and the rotation speed during the step for drying the substrate will generally be greater than or equal to the rotation speed during the step for moving the stream of methanol away from the center of the surface of the substrate toward the outer edge thereof. As examples, the rotation speed during the step for contacting the surface of the substrate with the stream of acetone can be in the range of 3000–5000 rpm; the rotation speed during the step for moving the stream of methanol away from the center of the surface of the substrate toward the outer edge thereof can be in the range of 2000–3000 rpm; and the rotation speed during the step for drying the substrate can be in the range of 2000–5000 rpm. As previously mentioned, the streams of acetone and methanol are overlapped in time for a few seconds or less; and the time for drying the substrate is generally 30 to 60 seconds.

The present invention also relates to a method for removing photoresist from a surface of a semiconductor substrate during semiconductor device fabrication which comprises rotating the substrate at a first rotation speed, and contacting the photoresist on the surface of the rotating substrate with a stream of acetone, thereby dissolving the photoresist, with the acetone and dissolved photoresist further being urged off the surface of the substrate by the rotation of the substrate; cleaning the surface of the substrate to remove any remaining acetone or dissolved photoresist from the surface of the substrate by contacting the surface of the substrate with a stream of methanol while the substrate is being rotated at a speed between the first rotation speed and a second rotation speed; and drying the substrate to remove any remaining methanol by continuing to rotate the substrate at a speed between the first and second rotation speeds for a time after the streams of acetone and methanol have been shut off.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1A:
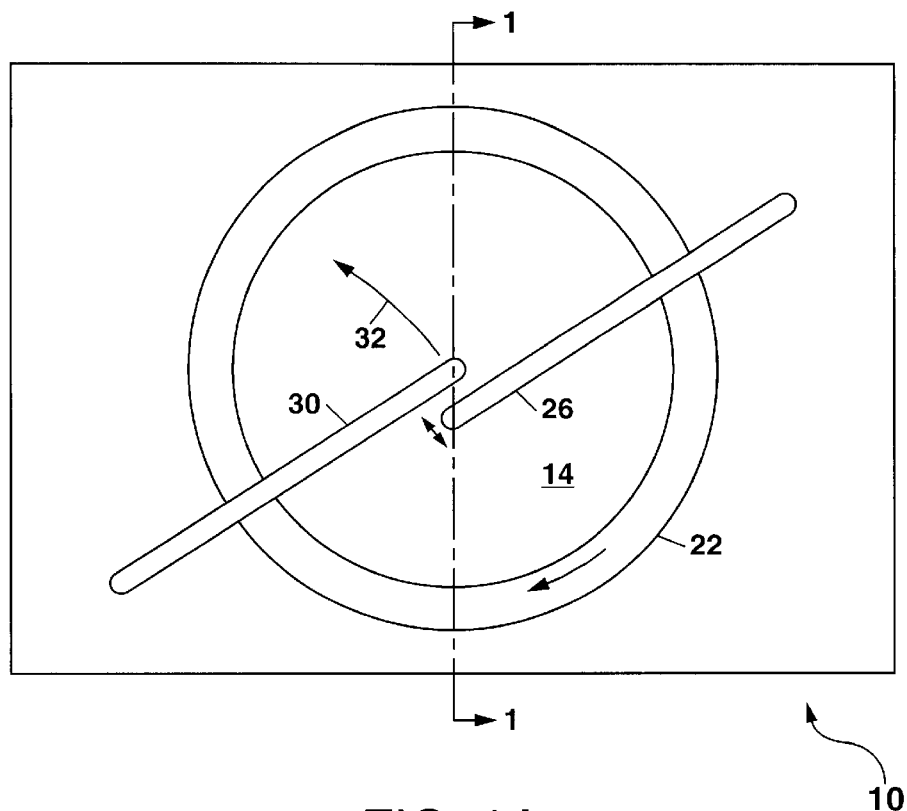
FIG. 1A shows a schematic plan view of an apparatus for reconditioning the surface of a semiconductor substrate to remove an unwanted layer of photoresist according to the present invention.
Figure 1B:
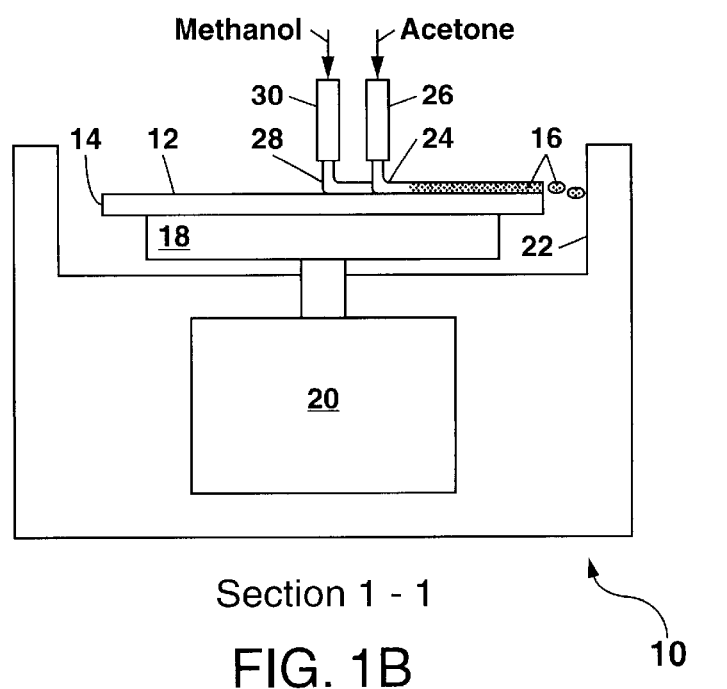
FIG. 1B shows a schematic cross-section view of the apparatus of FIG. 1A along the section line 1—1.

Referring to FIGS. 1A and 1B, there is shown a schematic plan view and a schematic cross-section view, respectively, of an apparatus 10 for carrying out the present invention. In FIGS. 1A and 1B, the apparatus 10 comprises a conventional automated spinner as used in the semiconductor industry for spin coating of photoresist or other materials onto semiconductor substrates. According to the present invention, this conventional spinner 10, which is preferably explosion-proof, is adapted to remove an unwanted layer of photoresist from a surface 12 of a semiconductor substrate 14 during a series of semiconductor device fabrication steps, thereby reconditioning the substrate 14 for reuse. This reconditioning process can be implemented in real time so that the substrate 14 being reconditioned can be reused and recoated with photoresist, preferably within the same batch of substrates from which it was diverted for reconditioning. This can reduce the cost of manufacture of semiconductor devices (e.g. integrated circuits or microelectromechanical devices) and improve the yield thereof.

The formation of a photoresist mask by photolithography during semiconductor device fabrication entails a series of well-known semiconductor process steps as known to the art. Photoresist comprises an organic polymer that forms an image pattern upon exposure and development. The patterned photoresist is resistant to various physical and chemical processes so that it can be used as a mask to protect various areas of the substrate whereon it is formed during subsequent semiconductor processing steps (e.g. ion implantation, wet or dry etching, material deposition etc.). The various process steps which are generally used to form a photoresist mask on a semiconductor substrate for semiconductor device manufacture include priming the surface of the substrate with a layer of hexamethyldisilazane (HMDS) to promote adhesion of a subsequently-applied layer of photoresist; spin coating the photoresist over the substrate surface; soft baking the substrate; exposing the photoresist with a pattern of light projected through a reticle; post baking the photoresist; developing the photoresist to form a patterned mask therefrom; and inspecting the patterned mask to ensure that it is of a high quality. A further discussion of photolithographic patterning of photoresist can be found in pages 193–280 of the book by Peter Van Zant entitled *Microchip Fabrication, A Practical Guide to Semiconductor Processing* published by McGraw-Hill (New York, 2000), which is incorporated herein by reference.

Due to the number of process steps required to form each patterned mask, and the number of masks required to build up the structure of a semiconductor device, the above mask formation process by photolithography must be carefully controlled to minimize the occurrence of defects (e.g. due to deviations in pattern dimensions; misaligned patterns; surface problems such as contamination, holes or scratches in the photoresist; and stains or other surface irregularities) which will affect the yield and quality of the resulting semiconductor devices. Thus, whenever a defective layer of photoresist 16 is discovered, immediate steps must be taken to remove the substrate 14 having the defects from further processing. As currently practiced, this generally entails removal of the defective substrate from a batch of substrates being simultaneously processed and sending the defective substrate to another processing bay where the defective photoresist 16 can be stripped (e.g. with a plasma). According to the present invention, however, considerable time and expense can be saved by stripping the defective photoresist 16 within the same bay used for photolithography by using the apparatus 10 of FIGS. 1A and 1B and the method of the present invention.

In FIGS. 1A and 1B, the method of the present invention utilizes a first solvent (e.g. acetone) to dissolve and thereby remove the photoresist 16 from the surface 12 of the substrate 14. A second solvent (e.g. methanol) is then used to wash any of the remaining first solvent and dissolved photoresist 16 off the surface 12 of the substrate 14 so that the substrate can be cleaned and dried. During this process, the substrate 14 is rotated at a high speed of several thousands of revolutions per minute (rpm) so that the centrifugal force produced by the substrate rotation is primarily responsible for removing the solvents and dissolved photoresist 16 off the surface 12 of the substrate 14, and so that any remaining solvent (principally the second solvent) can be evaporated off the surface 12 of the substrate 14.

The sequence of steps used to remove the photoresist 16 from the substrate 14 is as described hereinafter utilizing acetone as a preferred example of the first solvent and methanol as a preferred example of the second solvent. However, those skilled in the art will understand that other chemicals can be used for the first and second solvents depending upon the exact composition of the photoresist 16 to be removed from the substrate 14. Also, in this disclosure, the terms defective, substandard and unwanted are used interchangeably.

The substrate 14 having the defective layer of photoresist 16 thereon is mounted on a stage 18 of the apparatus 10 (also referred to herein as a spinner), with the stage 18 being coupled to a motor 20 through a shaft 22. The substrate 12 is mounted on the stage 18 with the layer of photoresist 16 facing upwards, and with a vacuum being applied to the bottom of the substrate 14 to hold the substrate 14 on the stage 18 (which is also termed a vacuum chuck). The placement of the substrate 12 onto the stage 18 and removal therefrom can be automated using a computer-controlled wafer loading and unloading system (not shown) as known to the art.

Once mounted on the stage 18, the substrate 14 can be spun up to a rotation speed of several thousand rpm using the motor 20, with the exact rotation speed of the substrate 14 being determined by the size of the substrate 14. For example, a six-inch diameter silicon substrate can be initially rotated at a speed of 3000 to 5000 rpm, and preferably about 4500 rpm. For a larger-diameter substrate 14, the initial rotation speed for removal of the photoresist 16 can be scaled down from the above numbers due to the larger radially-directed centrifugal force that can be produced at the outer edge of the larger substrate 14 (i.e. the centrifugal force increases proportional to the radius of the substrate 14). The goal here is to provide a sufficiently large centrifugal force to urge the dissolved photoresist 16 to smoothly flow toward the outer edge of the substrate 14 where the dissolved photoresist 16 forms droplets (see FIG. 1B) which are collected by a catch cup 22 surrounding the substrate 14, without the droplets upon impact with the catch cup 22 generating any backsplashing or backspattering onto the surface 12 of the substrate 14 being cleaned. An upper limit the rotation speed of the substrate 14 is also set by the generated centrifugal force the outer edge of the substrate 14 which, if too large, can fracture the substrate 14. For a given substrate size, an optimum rotation speed or range of rotation speeds can e learned from practice of the present invention.

To dissolve the photoresist 16, a stream of the first solvent 24 (e.g. acetone) is directed from a first moving-arm dispenser 26 (also termed herein a first dispensing arm) onto the surface 12 of the substrate 14 proximate to the center of the substrate 14. The term "stream" as used herein can also include a spray. Preferably, the stream of the first solvent 24 is initially directed at the center of the substrate 14 to dissolve the photoresist 16 at this location, with the first solvent 24 spreading over the entire surface 12 and dissolving the photoresist 16 thereon, and with the dissolved photoresist 16 and first solvent 24 being urged off the substrate 14 by the centrifugal force produced by rotation of the substrate 14. The stream of the first solvent 24 can be present on the substrate 14 for 30–60 seconds, with the exact time depending upon the composition and layer thickness of the photoresist 16 being removed. Once a majority of the photoresist 16 is dissolved and flung off the rotating substrate 14, the first dispensing arm 26 can be moved away from the center of the substrate 14 so that a stream of the second solvent 28 can be directed there as shown in FIG. 1B.

The stream of the second solvent 28 (e.g. methanol) from a second moving-arm dispenser 30 (also termed herein a second dispensing arm) in the apparatus 10 is used to clean the surface 12 of the substrate 14 by urging any of the remaining first solvent 24 and dissolved photoresist 16 off the substrate 14. In some cases, it may be preferable to combine the second dispensing arm 30 with the first dispensing arm 26 so that only a single dispensing arm is used that has two side-by-side orifices, with one orifice being used to provide the stream of the first solvent 24, and the other orifice being used to provide the stream of the second solvent 28.

According to the present invention, the stream of the second solvent 28 is preferably turned on a few seconds (e.g. 0.5–2 seconds) prior to the stream of the first solvent 24 being shut off and continues afterwards for sufficient time (e.g. 10–60 seconds) to clean any of the remaining first solvent 24 and dissolved photoresist 16 off the substrate 14. The first and second solvents, 24 and 28, used according to the present invention preferably have a purity that is commensurate with the type of semiconductor devices being formed on the substrate 14, and with other chemicals used in the manufacture of such devices.

In the schematic illustration of FIG. 1B, both streams 24 and 28 are present on the substrate 14 during the time immediately after the stream of the second solvent 28 has been turned on, but before the stream of the first solvent 24 has been shut off. This overlap of the streams 24 and 28 on the substrate 14 is advantageous since it prevents the surface 12 from drying out before the stream of the second solvent 28 can clean it. Also, at the time the stream of the second solvent 28 is first applied to the substrate 14, the substrate 14 is generally still rotating at the initial high speed used for dissolving and removing the layer of the photoresist 16. Afterwards, the rotation speed of the substrate 14 can be slowed down to prevent any backsplashing or backspattering of the second solvent onto the surface 12 of the substrate 14 which could otherwise disturb the drying process and affect the cleanliness of the surface 12. The goal here is to provide as high a rotation speed as is possible while minimizing the possibility for backsplashing or backspattering onto the substrate 14. The slowdown in rotation of the substrate 14 can be performed gradually over several seconds or more to a final speed which, in general, depends on the viscosity of the methanol and the size of the substrate 14. This final speed can be in the range of 2000–3000 rpm, and in particular can be about 2800 rpm for a six-inch-diameter silicon substrate 14.

During this step for cleaning the substrate 14, the second dispensing arm 30 gradually moves away from the center of the substrate 14 toward the outer edge thereof along the path 32 shown in FIG. 1B. This allows the stream of the second solvent 28 to more effectively sweep any of the remaining first solvent 24 and dissolved photoresist 16 off the substrate 14 and allows the surface 12 of the substrate 14 to begin to dry from the center outward. When the second dispensing arm 30 reaches a predetermined location near the outer edge of the substrate 14, the stream of the second solvent 28 can be shut off.

Once the stream of the second solvent 28 is shut off, the substrate 14 can be completely dried to remove any of the second solvent remaining on the surface 12 by continuing to rotate the substrate 14 and thereby evaporating the remaining second solvent 28 off the surface 12. The speed of rotation of the substrate 14 can be optionally increased to reduce the time required for drying the substrate 14. As an example, the rotation speed can be increased back up to the initial speed (e.g. 3000–5000 rpm). Alternately, the rotation speed can be maintained in the range of 2000–3000 rpm if desired. The time required for drying the substrate 14 after both the streams of the first and second solvents, 24 and 28, have been shut off is generally in the range of 30–60 seconds, and can be, for example, about 40 seconds for a six-inch-diameter silicon substrate being rotated at a speed of 4500 rpm. For other size substrates 14, an optimum time for drying the substrates 14 can be learned from practice of the present invention.

Control of the rotation speed, the movement of the first and second dispensing arms, 26 and 30, and the switching on and off of the streams of the first and second solvents, 24 and 28, can all be automated by a control unit associated with the spinner 10. The control unit can comprise a microprocessor or computer that is operatively connected to control and vary the speed of motor 20, to control additional motors (not shown) which move the arms 26 and 30, and to switch on and off valves for providing the first and second solvents from sources of supply to the arms 26 and 30 to generate the streams of the first and second solvents, 24 and 28. With automated operation as described above, the method of the present invention can recondition a substrate 14 to remove an unwanted layer of photoresist 16 therefrom in a couple of minutes or less and thereby restore the substrate 14 to the state in which it was before the photoresist 16 was applied.

According to the present invention, reconditioning of one or more substrates 14 within a batch can be performed at the same time that other photolithographic processing steps are occurring for other of the substrates 14 within the batch. Thus a substrate 14 having a defective layer of photoresist 16 thereon can be selected after inspection and routed from a particular location within the batch for reconditioning and removal of the defective photoresist 16 thereon and then can be reinserted back into the same batch at another position.

In an automated photolithography track having a pair of automated spinners with automatic wafer load/unload capability, one spinner can be used to apply the photoresist to the substrates, and another spinner (i.e. apparatus 10) can be adapted to recondition substrates 14 as needed using the method of the present invention. In this way, the substrates 14 can be reconditioned insitu without ever having to leave the photolithography track for reworking. A substrate 14 that is found to have an unacceptable layer of photoresist 16 after some point in the photolithography process can be redirected to the apparatus 10 to have the photoresist 16 removed according to the present invention and then can be immediately reused and recoated with photoresist.

The method of the present invention is relatively inexpensive to operate and can provide substantial savings in time and expense for reworking substrates 14 during semiconductor device fabrication. Since the method of the present invention can take place entirely within the photolithography track, production impacts are minimized, with very little additional time being required to rework the substrates 14 to provide an acceptable quality photoresist thereon. The method of the present invention is very clean and does not result in damage to critical layers or structures which can be on the substrate 14 prior to photolithography. This is in contrast to conventional plasma cleaning of photoresist which is typically relatively dirty, requiring a further acid or solvent cleaning step, and which can cause residual plasma damage (e.g. to transistor gates).

Other applications and variations of the present invention will become evident to those skilled in the art. For example, although the substrate 14 has been described herein with reference to a semiconductor substrate, those skilled in the art will understand that the term "substrate" can comprise any material (e.g. glass, fused silica, quartz, sapphire, metal, resin, ceramic or polymer) upon which a photoresist layer can be formed. The matter set forth in the foregoing description and accompanying drawings is offered by way of illustration only and not as a limitation. The actual scope of the invention is intended to be defined in the following claims when viewed in their proper perspective based on the prior art.

What is claimed is:

1. A method for reconditioning a surface of a semiconductor substrate to remove an unwanted layer of photoresist therefrom during semiconductor device fabrication, comprising:

(a) dissolving the layer of photoresist by rotating the semiconductor substrate and contacting the layer of photoresist on the surface of the rotating substrate with a stream of a first solvent comprising acetone, with the first solvent and the dissolved photoresist further being urged off the surface of the substrate by the rotation thereof;

(b) cleaning the surface of the substrate and removing any of the remaining first solvent or dissolved photoresist from the surface of the substrate by contacting the surface of the substrate with a stream of a second solvent comprising methanol while the substrate is being rotated at a rotation speed that is less than the rotation speed during the step of dissolving the layer of photoresist; and (c) drying the substrate and removing any of the remaining second solvent from the surface of the substrate by rotating the substrate for a time after the streams of the first and second solvents have been shut off.

2. The method of claim 1 wherein the semiconductor substrate comprises silicon.

3. The method of claim 1 wherein the rotation speed of the substrate is increased during the step for drying the substrate as compared to the rotation speed during the step for cleaning the surface of the substrate.

4. The method of claim 1 wherein the rotation speed of the substrate is at least 3000 revolutions per minute (rpm) during the step for dissolving the layer of photoresist.

5. The method of claim 1 wherein the rotation speed of the substrate is in the range of 2000–3000 rpm during the step for cleaning the surface of the substrate.

6. The method of claim 1 wherein the stream of the first solvent contacts the photoresist for a period of time to dissolve substantially all of the photoresist on the surface of the substrate.

7. The method of claim 1 wherein the stream of the first solvent is directed proximate to the center of the surface of the substrate during the step for dissolving the photoresist.

8. The method of claim 1 wherein the stream of the first solvent is shut off after the stream of the second solvent contacts the surface of the substrate.

9. The method of claim 1 wherein the step for drying the substrate proceeds for 30–60 seconds after both the streams of the first and second solvents have been shut off.

10. The method of claim 4 wherein the rotation speed of the substrate is at least 4000 rpm during the step for dissolving the layer of the photoresist.

11. The method of claim 7 wherein the stream of the second solvent is initially directed proximate to the center of the surface of the substrate during the step for cleaning the surface of the substrate, and is subsequently moved toward the edge of the substrate.

12. A method for removing photoresist from a semiconductor substrate during semiconductor device fabrication, comprising, in order, steps for:

(a) contacting a surface of the semiconductor substrate containing the photoresist to be removed with a stream of acetone while the substrate is being rotated, with the stream of acetone being initially directed proximate to the center of the surface of the substrate and thereby dissolving and removing at least a portion of the photoresist;

(b) contacting the surface of the substrate with a stream of methanol while the substrate is being rotated for removing any remaining dissolved photoresist from the surface of the substrate, with the stream of methanol being initially directed proximate to the center of the surface of the substrate, and overlapping in time with the stream of acetone, and with the stream of methanol continuing to be present for a period of time after the stream of acetone is shut off;

(c) moving the stream of methanol away from the center of the surface of the substrate toward an outer edge thereof during the period of time after the stream of acetone has been shut off, and simultaneously reducing the rotation speed of the substrate;

(d) shutting off the stream of methanol proximate to the outer edge of the substrate; and (e) drying the substrate by continuing to rotate the substrate for a time after the stream of methanol has been shut off.

13. The method of claim 12 wherein the semiconductor substrate comprises silicon.

14. The method of claim 12 wherein a rotation speed of the substrate during the step for contacting the surface of the substrate with the stream of acetone is higher than the rotation speed during the step for moving the stream of methanol away from the center of the surface of the substrate toward the outer edge thereof.

15. The method of claim 12 wherein the time for drying the substrate is in the range of 30–60 seconds.

16. The method of claim 14 wherein the rotation speed during the step for drying the substrate is higher than the rotation speed during the step for moving the stream of methanol away from the center of the surface of the substrate toward the outer edge thereof.

17. The method of claim 14 wherein the rotation speed during the step for contacting the surface of the substrate with the stream of acetone is in the range of 3000–5000 revolutions per minute (rpm).

18. The method of claim 14 wherein the rotation speed during the step for moving the stream of methanol away from the center of the surface of the substrate toward the outer edge thereof is in the range of 2000–3000 rpm.

19. The method of claim 17 wherein the rotation speed during the for drying the substrate is in the range of 2000–5000 rpm.

* * * * *